United States Patent   (10) Patent No.: US 10,699,768 B2
Vankayala et al.   (45) Date of Patent: Jun. 30, 2020

(54) APPARATUSES AND METHODS FOR COMMAND SIGNAL DELAY (71) Applicant: MICRON TECHNOLOGY, INC., Boise, ID (US)

(72) Inventors: Vijayakrishna J. Vankayala, Allen, TX (US); Jason M. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/104,124

(22) Filed: Aug. 16, 2018

(65) Prior Publication Data

US 2020/0058344 A1 Feb. 20, 2020

(51) Int. Cl.
*G11C 11/4076* (2006.01)
*G11C 11/408* (2006.01)

(52) U.S. Cl.
CPC ...... *G11C 11/4076* (2013.01); *G11C 11/4087* (2013.01)

(58) Field of Classification Search
CPC .................. G11C 11/4076; G11C 11/4087
USPC .................................................. 365/230.06
See application file for complete search history.

(56) References Cited

U.S. PATENT DOCUMENTS

| 10,014,043 B2 * | 7/2018 | Kang ............ G11C 7/222 |
| 2005/0254337 A1 * | 11/2005 | Lee ............ G11C 7/1045 |
| | | 365/233.1 |

\* cited by examiner

*Primary Examiner* — Fernando Hidalgo
(74) *Attorney, Agent, or Firm* — Dorsey & Whitney LLP (57) ABSTRACT

Apparatuses and methods for a command decoder delay are disclosed. An example apparatus includes a command decoder which may receive memory access command. The command decoder may provide an output command based on the memory access command to a command path at a first time. The command decoder may also provide the output command to a data path at a second time, wherein the second time is delayed relative to the first time.

18 Claims, 5 Drawing Sheets

APPARATUSES AND METHODS FOR COMMAND SIGNAL DELAY

BACKGROUND

High data reliability, high speed of memory access, and reduced chip size are features that are demanded from semiconductor memory. A semiconductor memory device may receive external commands to retrieve data from certain locations of the memory (e.g., a read command) and output that data. The memory device may operate with predetermined timing, such that, for example, there is a known timing between a read command being received and the corresponding data being output from the memory device. However, internally within the memory device, timing for command processing and data retrieval timing may finish earlier than the predetermined time at which the data is to be output, so the memory device may include a registers or buffers to store the retrieved data. However, additional buffers or registers may consume extra space and power on the memory device.

DETAILED DESCRIPTION OF THE EMBODIMENTS

The following description of certain embodiments is merely exemplary in nature and is in no way intended to limit the invention or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store data in a variety of data locations, and may retrieve the data in response to external commands, such as read commands. The read command may be provided to the memory device at a certain time. The memory device may retrieve data from a location corresponding to the provided read command. The memory device may delay outputting the retrieved data until a predetermined period of time has passed since the read command was received. This predetermined delay may be a property/setting/configuration of the system, such as a command access strobe (CAS) latency. Since both the time the read command was provided and the timing of the CAS latency are known, it can be known which read command each piece of data output by the memory corresponds to.

Because the data corresponding to a read command must be available at an output of the memory device at a predetermined time, the semiconductor memory device may be designed to have some margin such that it is capable of processing a received command and retrieving corresponding data a speed that is faster than the configured CAS latency. However, since data associated read command must be held until the predetermined time for output (e.g., until the configured CAS latency for the command corresponding to that data has expired), the memory may include registers or buffers at an output circuit to store the retrieved data until the configured CAS latency expires. The potential time gap between internal processing time and the configured CAS latency may be used to determine a capacity (e.g., or depth) of the output buffer. Because memory devices continue to get faster, the potential time gap between internal processing and the configured CAS latency may lead to output buffers having significant depth, and consume a larger area and more power on the memory device. It may be desirable to reduce a depth of the output buffers to conserve the additional space and power. The present disclosure is directed to an apparatus and method to delay processing of a command within the memory, which may increase a total internal processing time and delay provision of data to the output circuit to a time that is closer to the expiration of the CAS latency, which may be used to reduce a storage depth of the output buffer.

Figure 1:
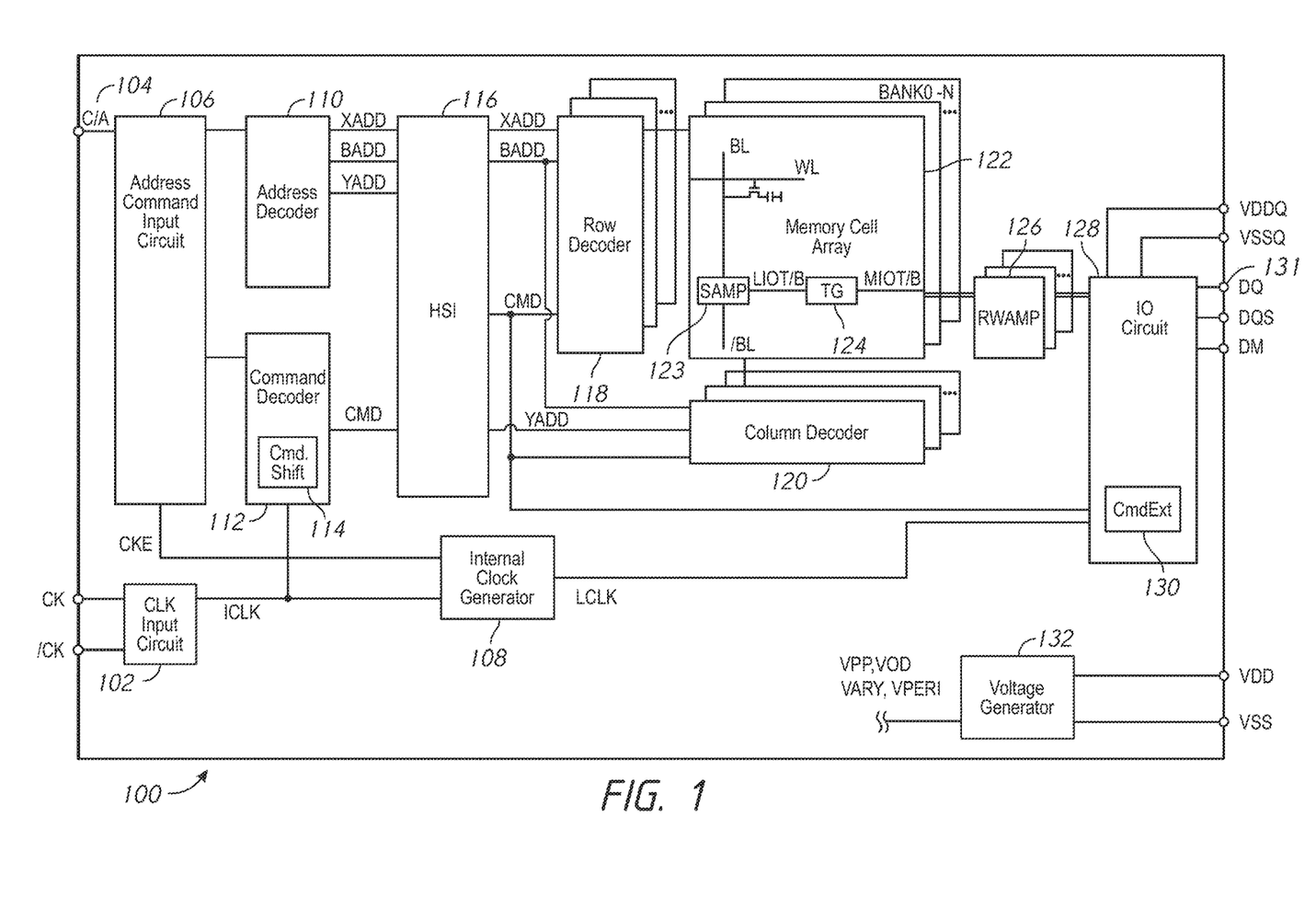
FIG. 1 is a schematic block diagram of a semiconductor device in accordance with an embodiment of the present disclosure.

FIG. 1 is a schematic block diagram of a semiconductor device 100, in accordance with an embodiment of the present disclosure. The semiconductor device 100 may include a clock input circuit 102, an address command input circuit 106, an internal clock generator 108, an address decoder 110, a command decoder 112 including a command shift circuit 114, a high speed interface (HSI) 116, a plurality of row (e.g., first access line) decoders 118, a plurality of column (e.g., second access line) decoders 120, a memory cell array 122 including sense amplifiers 123 and transfer gates 124, a plurality of read/write amplifiers 126, an input/output (I/O) circuit 128, and a voltage generator 132. The semiconductor device 100 may include a plurality of external terminals including address and command terminals (C/A) 104 coupled to command/address circuit 106, clock terminals CK and /CK, data terminals 131 (DQ, DQS, and DM), and power supply terminals VDD, VSS, VDDQ, and VSSQ. The terminals and signal lines associated with the command/address bus 106 may include a first set of terminals and signal lines that are configured to receive the command signals and a separate, second set of terminals and signal lines that configured to receive the address signals, in some examples. In other examples, the terminals and signal lines associated with the command and address bus 106 may include common terminals and signal lines that are configured to receive both command signal and address signals. The semiconductor device may be mounted on a substrate, for example, a memory module substrate, a mother board or the like.

The semiconductor device 100 may be a semiconductor memory device, such as dynamic random-access memory (DRAM). The semiconductor device 100 may have a memory cell array 122 which may have a plurality of memory cell storing data. The memory cell array 122 includes a plurality of banks BANK0-N, where N is a positive integer, such as 3, 7, 15, 31, etc. Each bank BANK0-N may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 118 and the selection of the bit line BL is performed by a corresponding column decoder 120.

The address/command input circuit 106 may receive an address signal and a bank address signal from outside at the command/address terminals via the command/address bus 104 and transmit the address signal and the bank address signal to the address decoder 110. The address decoder 110 may decode the address signal received from the address/command input circuit 104 and provide the bank address signal BADD, the row address signal XADD and the column address signal YADD to the HSI 116.

The address/command input circuit 106 may receive a command signal at the command/address terminals via the command/address bus 104. The command signal may be external, such as, for example, from a memory controller. The command decoder 112 may decode the command signal and provide and/or generate various internal command signals. For example, the internal command signals may include a row command signal to select a word line, a column command signal, such as a read command or a write command, to select a bit line. The command decoder 112 may provide one or more of these command signals to the HSI 116 (here shown as a single command signal CMD for clarity). The command decoder 112 may include a command shift circuit 114 that is configured to delay output of one or more of the command signals based on a comparison with a configured CAS latency and internal latency between provision of the command to the HSI 116 and corresponding data being available at the IO circuit 128, which may include row address to column address latency tRCD. In some examples, the command shift circuit 114 may determine the internal latency of the semiconductor device 100 using modeling circuitry, and may delay or shift the CMD signal based on the determined internal latency. In some examples, the command delay or shift may be determined by subtracting the determined internal latency from the CAS latency. In some examples, the command delay or shift may be further reduced to allow some additional margin.

The HSI 116 may act as an interface between the address decoder 110 and command decoder 112 and the row decoders 118 and column decoders 120 for each of the plurality of memory banks BANK0-N to route command and address signals to the target row decoder 118 and column decoder 120. That is, the HSI 116 may provide the row address XADD and the column address YADD to a specific bank of the row decoder 118 and the column decoder 120 based on the bank address signal BADD. The HSI 116 may also perform certain operations based on the received addresses and command signals. For example, the HSI 116 may generate read/write latency counting and/or perform an activate/precharge operation of the memory cell array 122. The operation of the HSI 116 may be controlled by the command signals CMD and/or address signals XADD, YADD, and BADD or may be controlled with a chip select signal.

Accordingly, when a read command is issued and a row address and a column address are timely supplied with the read command, read data is read from a memory cell in the memory cell array 122 designated by the row address and the column address. The read/write amplifiers 126 may receive the read data. DQ and provide the read data DQ to the IO circuit 128. The IO circuit 128 may provide the read data DQ to a location outside the semiconductor device 100 via the data terminals 131 DQ together with a data strobe signal at DQS and a data mask signal at DM. Similarly, when the write command is issued and a row address and a column address are timely supplied with the write command, and then the input/output circuit 128 may receive write data at the data terminals 131 DQ together with a data strobe signal at DQS and a data mask signal at DM and provide the write data via the read/write amplifiers 126 to the memory cell array 122. Thus, the write data may be written in the memory cell designated by the row address and the column address. To control timing of receiving input data and transmitting output data, the IO circuit 128 may include a command extension circuit 130. The command extension circuit 130 may delay provision of the output data based on a phase-controlled internal clock signal LCLK. The delay may be based on system settings or configurations of the semiconductor device 100 (e.g., a CAS latency setting).

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 102. The clock input circuit 102 may receive the external clock signals and generate an internal clock signal ICLK. The clock input circuit 102 may provide the internal clock signal ICLK to an internal clock generator 108. The internal clock generator 108 may generate a phase controlled internal clock signal LCLK based on the received internal clock signal ICLK and a clock enable signal CKE from the address/command input circuit 106. Although not limited thereto, a DLL circuit may be used as the internal clock generator 108. The internal clock generator 108 may provide the phase controlled internal clock signal LCLK to the IO circuit 128.

The power supply terminals may receive power supply voltages VDD, VPP and VSS. These power supply voltages VDD, VPP and VSS may be supplied to a voltage generator circuit 132. The voltage generator circuit 132 may generate various internal voltages, VCCP, VOD, VARY, VPERI, and the like based on the power supply voltages VDD and VSS. The internal voltage VPP are mainly used in the row decoder 118 and column decoder 120, the internal voltages VOD and VARY are mainly used in the sense amplifiers 123 included in the memory cell array 122, and the internal voltage VPERI is used in many other circuit blocks. The IO circuit 128 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 128.

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 2:
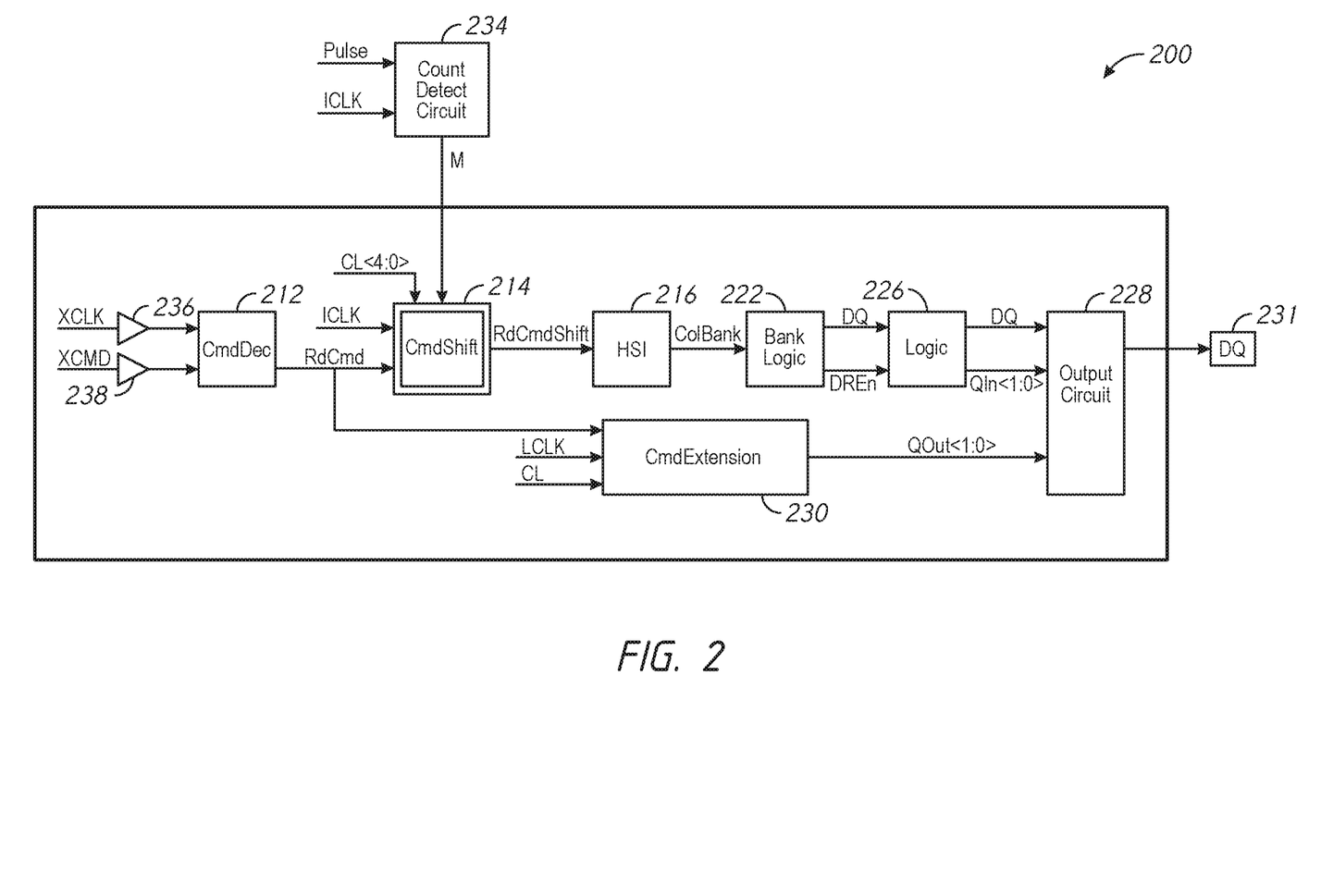
FIG. 2 is a schematic diagram of timing delay elements of a semiconductor device in accordance with an embodiment of the disclosure.

FIG. 2 is a schematic diagram of timing delay elements of a semiconductor device 200 in accordance with an embodiment of the disclosure. In some examples, the semiconductor device 100 of FIG. 1 may implement one or more of the timing delay elements of the semiconductor device 200 of FIG. 2. FIG. 2 may represent a simplified view of a semiconductor device 200 by depicting only components and connections relevant to performing a read command and the timing of that read command. Other connections and components may exist in the semiconductor device 200 that are not depicted in the simplified view of FIG. 2.

FIG. 2 shows a semiconductor memory device 200 including a command decoder circuit 212 coupled to external clock and command signals (XCLK and XCMD, respectively) via a clock buffer 236 and a command buffer 238. In some examples, the XCLK signal may correspond to the ICLK signal generated from the external CK and /CK signals of FIG. 1 and the XCMD signal may correspond to commands received via the address and command terminals (C/A) 104 and the command/address bus 106 of FIG. 1. The command decoder circuit 212 provides a read command RdCmd along a data path that includes a command shift circuit 214, a high speed interface (HSI) 216, memory bank logic (bank logic) 222, additional logic circuits 226, and an output circuit. The command decoder circuit 212 also provides the RdCmd along a command path that includes the command decoder 212, a command extension circuit 230, and the output circuit 228.

The command shift circuit 214 is coupled to the HSI 216 and is configured to provide the read command shifted or delayed as RdCmdShift based on a count value M from a count detection circuit 234 and based on a configured CAS latency from the CAS latency signal CL. The HSI 216 may decode the RdCmdShift signal to provide the bank logic 222 control signals ColBank. The bank logic 222 may include row decoders (e.g., the row decoder 118 of FIG. 1), command decoders (e.g., the command decoder 120 of FIG. 1), a memory cell array with sense amplifiers and I/O lines (e.g., the memory cell array 122 of FIG. 1), or any combination thereof, that are configured to perform a memory access operation based on the ColBank signals, data DQ and a read enable signal DREn to the logic circuits 226. The logic 226 may include a read/write amplifier, such as one of the read/write amplifiers 126 of FIG. 1. The logic 226 is configured to provide the data DQ to an output circuit according to an input clock signal QIn<1:0>. The output circuit 228 may store the data DQ in response to and at a location indicated by the QIn<1:0> signal.

The command extension circuit 230 may be configured to receive a phase shifted internal clock signal LCLK and the CL signal, in addition to the RdCmd signal, and to an output clock signal QOut<1:0> to the output circuit 228. The output circuit 228 provide stored data DQ in response to and from a location indicated by the QOut<1:0> signal, to an output pad 231.

In operation, the memory device 200 is configured to receive a command via the XCMD signal, to decode the received command, and in response to decoded command being a read command RdCmd, to retrieve data DQ from a memory address of the memory cell array of the bank logic 222 associated with the RdCmd. The retrieved data DQ is provided to an output circuit 228, which is configured to store the data DQ in response to the QIn<1:0> at a first time and to provide the stored data DQ to an output terminal 231 in response to the QOut<1:0> signal at a second time. The QOut<1:0> signal may be provided to the output circuit 228 a predetermined amount of time after receipt of the command via the XCMD signal at the command decoder 212. The delay between receipt of the command via the XCMD signal and provision of the QOut<1:0> signal to the output circuit 228 may be based on a column access strobe (CAS) latency CL. The CL may be expressed as a number of pulses of the XCLK signal.

The command decoder 212 (e.g., along with other components not shown here, such as the clock input circuit 102 and/or internal clock generator 108 of FIG. 1) may provide one or more internal clock signals based on the external clock signal XCLK, such as the ICLK signal.

The data retrieval operation triggered by the RdCmd may take some amount of time to propagate through the HSI 216, the bank logic 222, and the logic circuits 226 before the data DQ is provided to the output circuit 228 in response to the QIn<1:0> signal. To reduce a length of time data DQ is stored at the output circuit 228 (e.g., and a number of different data DQs that may need to be stored), the command shift circuit 214 may provide an additional delay to the RdCmd before being provided to the data path such that the data DQ is provided to and stored at the output circuit 228 closer to the time the data DQ is to be provided to the output pad 231 in response to the QOut<1:0> signal.

Although shown in FIG. 2 as a separate component, the command shift circuit 214 may be a part of the command decoder 212 in certain embodiments. The command shift circuit receives the RdCmd, the ICLK signal, the CL, and the count value M as inputs. The command shift circuit 214 may be synchronized to the ICLK signal, (e.g., internal clock signal ICLK of FIG. 1). The command shift circuit 214 provides a delayed (e.g., or time-shifted) version of the RdCmd as the RdCmdShift. The RdCmdShift may be the same signal as the RdCmd, except that the RdCmdShift is provided a set number of clock cycles after the RdCmd is received at the command shift circuit 214. The number of clock cycles of the ICLK signal by which the RdCmd Shift is delayed may be based on the modeled delay count value M from the count detect circuit 234 and on the CL.

The count detect circuit 234 may be configured to provide the modeled delay count M to the command shift circuit 214 based on the ICLK signal and on a pulse signal. The count detect circuit 234 may be a separate component, as shown, or may be a part of the command shift circuit 214. The count detect circuit 234 may determine an expected internal latency of the HSI 216, the bank logic 222, and the logic 226 from the time the RdCmdShift is provided to the HSI 216 until the data DQ is provided at an output of the logic 226. The modeled delay count M may indicate a number of clock cycles of internal latency. In some examples, the count detect circuit 234 may include circuitry that models circuitry of the HSI 216, the bank logic 222, and/or the logic 226. To count clock cycles of the internal latency of those circuits, a pulse may be provided on the pulse signal, and the count detect circuit 234 counts a number of clock cycles of the ICLK signal that it takes for the pulse on the pulse signal to propagate through the model circuitry.

The command shift circuit 214 may determine a delay between receiving the read command RdCmd and providing the delayed read command RdCmdShift based on the CL and the modeled delay count NI. The CL may be a stored property of the memory device 200, and may be set based on a desired operation of the memory device 200 and/or physical parameters of the memory device (e.g., a maximum speed of operation). The delay between the read command RdCmd and delayed read command RdCmdShift may be based on a difference between the CL and the modeled delay count M (e.g., the delay is CL-M). In some examples, the command shift circuit 214 may further decrease the delay by N clock cycles to provide some timing margin (e.g., the delay of the command shift circuit 214 is CL-M-N). In some embodiments, N may be set to one or two additional clock cycles, although more clock cycles may be added without departing from the scope of the disclosure.

The HSI 216 may receive the RdCmdShift and may provide the ColBank signals to the bank logic 222. In some examples, the HSI 216 may also receive address information, and may interpret the RdCmdShift and the address information to provide the ColBank signals to the bank logic 222. The ColBank signals may specify a bank of memory and target location within that bank to which the RdCmdShift is directed. The bank logic 222 may provide data DQ and the DREn signal to the logic 226. In some examples, the bank logic 222 may correspond to circuitry associated with a specific bank of memory, such as a specific row decoder, column decoder, and memory cell array. The bank logic 222 may retrieve data DQ from a cell (or cells) corresponding to the RdCmdShift. The logic 226 may provide data DQ and the QIn<1:0> signal to the output circuit 228. The output circuit 228 may store the data DQ at a location identified by the QIn<1:0> signal. For example, the QIn<1:0> signal may increment for each received data DQ until a maximum value is reached, and then may reset to an initial value. The output circuit 228 may read the QIn<1:0> signal to determine in which location the data DQ should be stored.

Along the command path, the command extension circuit 230 receives the RdCmd from the command decoder 212, the ICLK signal, and the CL<4:0> inputs. The command extension circuit 230 is configured to, in response to receiving the RdCmd, provide the QOut<1:0> signal after a set number of clock cycles of the LCLK signal. The set number of clock cycles may be based on the CL. The CL may be set between and including about 28 to 32 clock cycles, in some examples. The CL may be set to other values without departing from the scope of the disclosure.

The output circuit 228 receives data DQ, the QIn<1:0> signal, and QOut<1:0> signal as inputs. The output circuit stores the data. DQ in response to the QIn<1:0> signal at a location identified by the QIn<1:0> signal and provides stored data DQ to the output terminal 231 in response to the QOut<1:0> signal at a location identified by the QOut<1:0> signal. The output circuit 228 may include a first-in, first-out (FIFO) buffer with a maximum number of data entries that can be stored at once (depth). The depth of the FIFO buffer may be based on a difference between the internal latency of the memory device 200 along the data path and the CL. If that difference is reduced, then depth of the FIFO buffer may be reduced. In some examples, a number of bits of the QIn<1:0> signal and the QOut<1:0> signal may be based on the depth of the output circuit 228. By adding the delay via the command shift register, the depth of the output circuit 228 may be reduced as compared with implementations that do not include any delay of the RdCmd.

Figure 3:
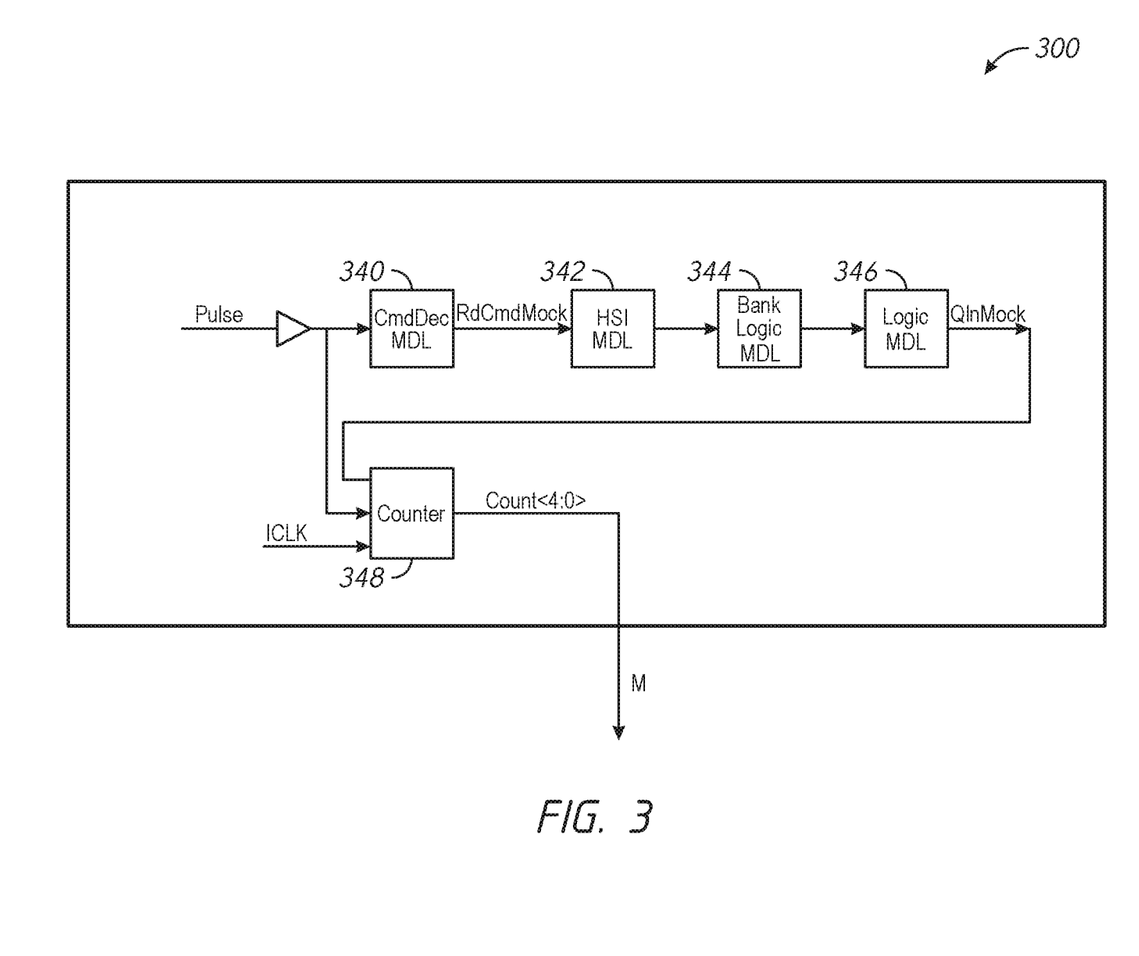
FIG. 3 is a schematic block diagram of a count detect circuit in accordance with an embodiment of the disclosure.

FIG. 3 is a schematic block diagram of a count detect circuit 300 in accordance with an embodiment of the disclosure. The count detect circuit 234 of FIG. 2 may be implement the count detect circuit 300, in certain embodiments. The count detect circuit 300 provides the modeled delay count M based on a propagation delay of a pulse signal through a modeled path that includes a command decoder model 340, a HSI model 342, a bank logic model 344, and a logic model 346. The modeled delay count M may indicate the propagation delay in terms of clock cycles of an ICLK signal. In some examples, the count detect circuit 300 may determine the modeled delay count M after each DLL reset.

In operation, such as after a DLL reset (e.g., on power-up), Pulse is provided on the pulse signal to the command decoder model 340. The command decoder model 340 provides a mock read command RdCmdMock to the other model components 342-346. The model elements 342-346 may propagate the Pulse and the logic model 346 may provide a mock input clock signal QInMock at an output. The counter 348 may be synchronized to the ICLK signal. The start of the counting operation and the pulse on the pulse signal may be synchronized with timing of the ICLK signal. The counter 348 may provide a count of the ICLK signal from the time the pulse is provided to the time the QInMock signal is received from the logic model 346.

Each of the model circuits 340-346 may model latency characteristics of a corresponding operational circuit of a memory device. For example, the command decoder model 340 may model latency characteristics of a command decoder, such as the command decoder 112 of FIG. 1 and/or the command decoder 212 of FIG. 2. The HSI model 342 may model latency characteristics of an HSI, such as the HSI 116 of Figure and/or the HSI 216 of FIG. 2. The bank logic model 344 may model latency characteristics of the row decoder 118, column decoder 120, and/or the memory cell array 122 of FIG. 1 and/or the bank logic 222 of FIG. 2, and the logic model 346 may model latency characteristics of the read/write circuits 126 of FIG. 1 and/or the logic 226 of FIG. 2. The models 340-346 may provide a delay between receiving the pulse and providing the QInMock signal in to simulate an expected operation time of their corresponding elements. In some examples, the models 340-346 may each include a number of gates to match a number of gates of the corresponding elements. The models 340-346 may have different internal structure than their corresponding element, while still being able to model latency characteristics.

Figure 4:
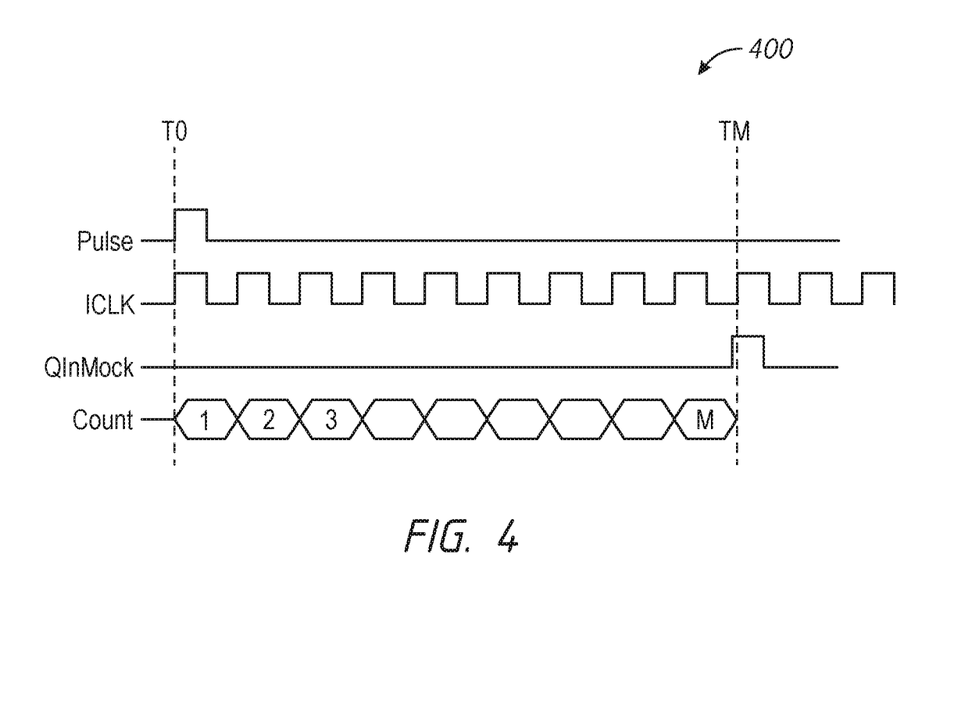
FIG. 4 is an exemplary timing diagram depicting operation of a count detect circuit in accordance with embodiments of the disclosure.

FIG. 4 is an exemplary timing diagram 400 depicting operation of a count detect circuit in accordance with embodiments of the disclosure. In some embodiments, the timing diagram 400 may represent the operation of the count detection circuit 200 of FIG. 2 and/or the count detect circuit 300 of FIG. 3. Other example circuits may have a different number and/or type of signals, and may operate in a different manner to produce the modeled delay count M. The pulse signal may correspond to the pulse signal of FIG. 3. The ICLK signal may correspond to the ICLK signal of any combination of FIGS. 1-3. The QInMock signal may correspond to the QInMock signal of FIG. 3. The count<4:0> signal providing the count value M may correspond to the modeled delay count M signal of any combination of FIGS. 2 and 3.

At time T0, the pulse signal may provide a single pulse synchronized to the ICLK signal. The pulse signal may propagate through model circuitry, such as the model circuits 340-346 of FIG. 3 between times T0 and TM. The count<4:0> value may increment in response to each clock cycle of the ICLK signal starting from time T0. At time TM, a pulse may be received on the QInMock signal. In response to the pulse on the QInMock signal, the count<4:0> value may hold at the count value of M. The count<4:0> value M may be provided to a command shift circuit (e.g., the command shift circuit 114 of FIG. 1 and/or the command shift circuit 214 of FIG. 2) as the modeled delay count M.

The timing diagram 400 is exemplary for illustrating operation of various described embodiments. Although the timing diagram 400 depict a particular arrangement of signal transitions of the included signals, one of skill in the art will appreciate that additional or different transitions may be included in different scenarios without departing from the scope of the disclosure. Further, the depiction of a magnitude of the signals represented in the timing diagram 400 are not intended to be to scale, and the representative timing is an illustrative example of a timing characteristics.

Figure 5:
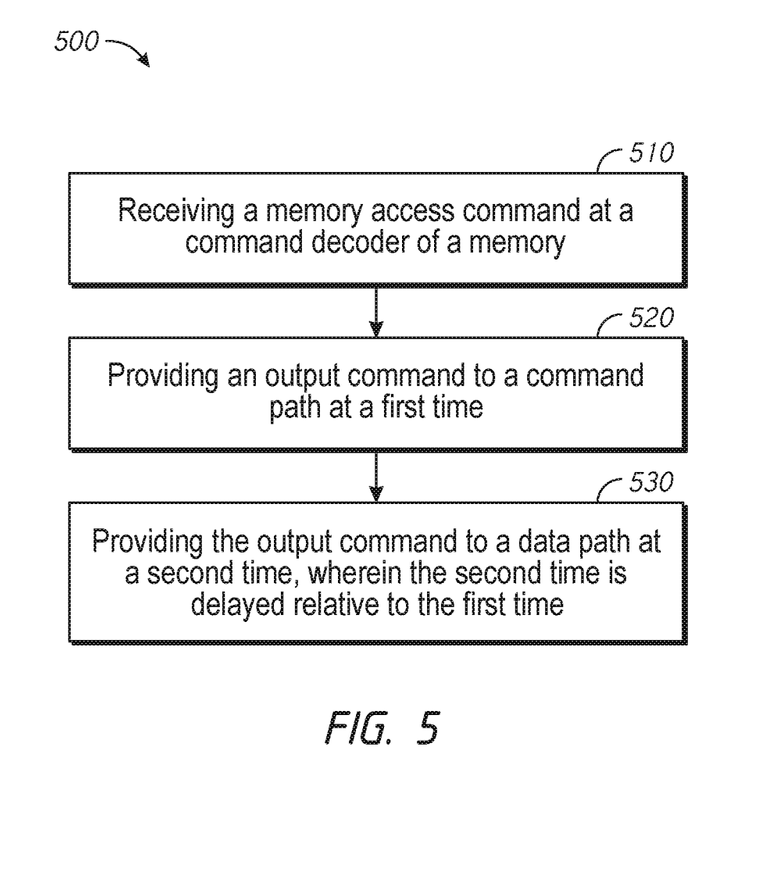
FIG. 5 is a flow chart depicting a method of delaying memory access commands in accordance with embodiments of the disclosure.

FIG. 5 is a flow chart depicting a method of delaying memory access commands in accordance with embodiments of the disclosure. In certain embodiments, the method may be performed by one or more the circuits of FIG. 1-4. Certain steps of the method may be repeated and/or performed in a different order than described here. Certain additional steps not described herein may be performed as part of the method, and may be performed between one or more of the described steps.

FIG. 5 depicts a method 500 of delaying command signals to an output circuit, in accordance with embodiments of the present disclosure. The method 500, all or in part, may be performed, for example, by the semiconductor device 100 of FIG. 1, the memory device 200 of FIG. 2, and/or the count detect circuit 300 of FIG. 3. The method includes receiving a memory access command at a command decoder of a memory at 510. The method may also include providing an output command to a command path at a first time at 520. The method may also include providing the output command to a data path at a second time, wherein the second time is delayed relative to the first time at 530.

The method includes receiving a memory access command at a command decoder of a memory at 510. The memory access command may specify an operation (such as a read operation) and a memory location. The command decoder may be part of a memory device, such as command decoder 112 of memory device 100 of FIG. 1. The memory access command may be a command signal received from an external source, such as on C/A terminal 104 of FIG. 1 of external command buffer 238 of FIG. 2.

The method may further include, in response to the received memory access command, providing an output command to a command path at a first time at 520. An output command may be generated in response to the received memory access command. The output command may direct components of the memory to retrieve data from the specified memory location. The command path may include a command extension circuit and an output circuit (e.g., command extension circuit 130 and output circuit 128 of FIG. 1 or the command extension circuit 230 and output circuit 228 of FIG. 2). The command extension circuit may delay the output command before providing the output command to an output circuit. The output command may be the data DQ and/or the signal Qin<1:0> of FIG. 2.

The method may further include, in response to the received memory access command, providing the output command to a data path at a second time, wherein the second time is delayed relative to the first time at 530. The data path may include components of the memory (e.g., HSI 116, row decoder 118, column decoder 120, memory bank 122, read/write amplifier 126 of FIG. 1 or HSI 211, bank logic 222, logic 226 of FIG. 2). The command decoder may delay sending the output command to the data path until after the output command is sent to the command path. The command decoder may provide the command signal to the command path and to a command shift circuit coupled to the data path at a first time, and the command shift circuit may delay outputting the command signal to the data path until a second time.

The delay between the first and the second time may be based on a propagation delay of a signal along the data path. The method may include modeling the propagation delay of the data path to determine the relative delay between the first time and the second time. The modeling may be performed by a count detect circuit, such as the count detect circuit 234 of FIG. 2 or the count detect circuit 300 of FIG. 3. The configuring of the delay between the first and second time may be based on subtracting the modeled propagation delay from the column access strobe (CAS) latency. The subtraction may be calculated by the command shift circuit 114 of FIG. 1 or the command shift circuit 214 of FIG. 2. The command shift circuit may further subtract additional time from the difference between the CAS latency and the modeled propagation delay to provide a timing margin.

The method may further include receiving output data at an output circuit at a third time based on a propagation delay of the data path and outputting the output data from the output circuit at a fourth time based on a column access strobe (CAS) latency from receipt of the memory access command at the memory decoder. The output circuit may be the output circuit 128 of FIG. 1 or the output circuit 228 of FIG. 2.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
a command decoder configured to receive memory access command, the command decoder configured to provide an output command based on the memory access command to a command path at a first time, the command decoder further configured to provide the output command to a data path at a second time, wherein the second time is delayed relative to the first time, wherein the command decoder is configured to delay provision of the output command to the data path until the second time based on a column access strobe (CAS) latency.

2. The apparatus of claim 1, wherein the command decoder is configured to delay provision of the output command to the data path until the second time further based on a propagation delay of the data path.

3. The apparatus of claim 2, wherein the command decoder comprises a command shift circuit configured to receive the output command at the first time, the CAS latency, and a count value, wherein the count value is based on the propagation delay of the data path, wherein the command shift circuit is configured to delay provision of the output signal to the data path to the second time based on a difference between the CAS latency and the count value.

4. The apparatus of claim 3, further comprising a count detect circuit configured to model the propagation delay of the data path to determine the count value.

5. An apparatus comprising:
a command decoder configured to receive memory access command, the command decoder configured to provide an output command based on the memory access command to a command path at a first time, the command decoder further configured to provide the output command to a data path at a second time, wherein the second time is delayed relative to the first time, wherein the command path comprises a command extension circuit configured to receive the output signal at the first time; and provide the output signal at a third time after a command delay, wherein the command delay is based on the CAS latency.

6. The apparatus of claim 5, further comprising an output circuit coupled to the data path and to the command path, wherein the output circuit is configured to receive data at the second time and provide the data in response to the third signal at the third time.

7. The apparatus of claim 6, wherein the output circuit includes a FIFO circuit.

8. A method comprising:
receiving a memory access command at a command decoder of a memory;
providing an output command to a command path at a first time;
providing the output command to a data path at a second time, wherein the second time is delayed relative to the first time;
receiving output data at an output circuit at a third time based on propagation delay of the data path; and
outputting the output data from the output circuit at a fourth time based on a column access strobe latency from receipt of the memory access command at the command decoder.

9. A method comprising:
receiving a memory access command at a command decoder of a memory;
providing an output command to a command path at a first time;
providing the output command to a data path at a second time, wherein the second time is delayed relative to the first time; and
configuring the relative delay between the first time and the second time based on a propagation delay of the data path.

10. The method of claim 9, further comprising modeling the propagation delay of the data path to determine the relative delay between the first time and the second time.

11. The method of claim 10, wherein the configuring the delay comprises subtracting the modeled propagation delay from a column access strobe (CAS) latency.

12. The method of claim 11, wherein the configuring the delay further comprises subtracting additional time from the CAS latency to provide a timing margin.

13. An apparatus comprising:
a data path circuit that includes memory components that are configured to retrieve data in response to a command signal received at a first time and configured to provide the data and an input signal at a second time;
a command path circuit that includes a command extension circuit configured to, in response to the command signal received at a third time, provide an output signal at a fourth time, wherein the first time is after the third time and the fourth time is after the second time; and
an output circuit configured to store the data at the second time in response to the input signal and provide the stored data to an output at the fourth time in response to the output signal; and
a command decoder circuit configured to receive a command signal and to provide the command signal to the command path at the third time and to selectively provide the command signal to the data path at the first time.

14. The memory of claim 13, wherein the command decoder circuit comprises a command shift circuit configured to selectively delay the first time relative to the third time.

15. The apparatus of claim 14, wherein the delay between the third time and the first time is based, at least in part, on the modeled difference between the first time and the second time.

16. The apparatus of claim 15, wherein the command shift circuit is coupled to a count detect circuit configured to provide a model of the difference between the first time and the second time.

17. The apparatus of claim 15, wherein the count detect circuit comprises models configured to model latency characteristics at least some of the memory components.

18. The apparatus of claim 13, wherein the fourth time is a margin number of clock cycles from the third time.

* * * * *